(12) United States Patent
Morimoto et al.

(10) Patent No.: US 7,563,697 B2
(45) Date of Patent: Jul. 21, 2009

(54) METHOD FOR PRODUCING SOI WAFER (75) Inventors: Nobuyuki Morimoto, Tokyo (JP); Hideki Nishihata, Tokyo (JP)

(73) Assignee: Sumco Corporation, Tokyo (JP)

( * ) Notice: Subject to any disclaimer, the term of this patent is extended or adjusted under 35 U.S.C. 154(b) by 634 days.

(21) Appl. No.: 10/570,353

(22) PCT Filed: Sep. 3, 2004

(86) PCT No.: PCT/JP2004/012822

§ 371 (c)(1), (2), (4) Date: Mar. 3, 2006

(87) PCT Pub. No.: WO2005/024925

PCT Pub. Date: Mar. 17, 2005

(65) Prior Publication Data

US 2009/0023269 A1    Jan. 22, 2009

(30) Foreign Application Priority Data

Sep. 5, 2003  (JP)  ............... 2003-314756
Sep. 5, 2003  (JP)  ............... 2003-314757

(51) Int. Cl.
*H01L 21/322*    (2006.01)

(52) U.S. Cl. ............... 438/475; 438/311; 438/770; 257/E21.32; 257/E21.229; 257/E21.319; 257/E21.568

(58) Field of Classification Search ............... 438/311, 438/474, 475, 506, 509, 513, 514, 770, 773
See application file for complete search history.

(56) References Cited

U.S. PATENT DOCUMENTS

| 6,372,609 | B1 * | 4/2002 | Aga et al. ............... 438/459 |
| 6,846,718 | B1 * | 1/2005 | Aga et al. ............... 438/406 |
| 6,962,858 | B2 | 11/2005 | Neyret et al. |
| 7,029,993 | B1 | 4/2006 | Barge et al. |

(Continued)

FOREIGN PATENT DOCUMENTS

EP   1045448   10/2000

(Continued)

OTHER PUBLICATIONS

U.S. Appl. No. 11/851,065 (Nishihata et al.), which was filed on Sep. 6, 2007 and entitled, "Bonded Wafer and Method of Manufacturing the Same."

(Continued)

*Primary Examiner*—David Nhu
(74) *Attorney, Agent, or Firm*—Greenblum and Bernstein P.L.C.

(57) ABSTRACT

Hydrogen gas is ion-implanted into a silicon wafer for active layer via an insulating film, and thus ion-implanted wafer is then bonded with a supporting wafer via an insulating film interposed therebetween. This bonded wafer is heated to 500° C., so that a part of the bonded wafer is cleaved and separated, thereby producing an SOI wafer. Subsequently, thus-obtained SOI wafer is subjected to a heat treatment in an argon gas atmosphere. After that, the SOI wafer is subjected to an oxidation process in an oxidizing atmosphere, and thus formed oxide film is removed using an HF solution. Consequently, the surface of the SOI wafer is recrystallized and thus planarized.

5 Claims, 4 Drawing Sheets

U.S. PATENT DOCUMENTS

| | | | |
|---|---|---|---|
| 7,288,418 | B2 | 10/2007 | Barge et al. |
| 2004/0063298 | A1 | 4/2004 | Aga et al. |
| 2007/0026637 | A1* | 2/2007 | Endo et al. ................. 438/459 |
| 2007/0032043 | A1* | 2/2007 | Endo et al. ................. 438/459 |

FOREIGN PATENT DOCUMENTS

| | | |
|---|---|---|
| EP | 1158581 | 11/2001 |
| FR | 2797713 | 2/2001 |
| JP | 2000-124092 | 4/2000 |
| JP | 2003-224247 | 8/2003 |
| JP | 2003-509838 | 8/2003 |
| JP | 2004-259970 | 9/2004 |
| WO | 01/28000 | 4/2001 |
| WO | WO 03/005434 | 1/2003 |

OTHER PUBLICATIONS

English Language Abstract of WO03/005434.
English Language Abstract of FR 2,797,713.
English Language Abstract of EP 1,158,581.
English Language Abstract of EP 1,045,448.
English language Abstract of JP 2003-224247.
English language Abstract of JP 2004-259970.
U.S. Appl. No. 10/570,354 to Morimoto et al., which was filed on Mar. 3, 2006.
U.S. Appl. No. 10/570,665 to Endo et al., which was filed on Mar. 6, 2006.
U.S. Appl. No. 10/570,669 to Endo et al., which was filed on Mar. 6, 2006.
U.S. Appl. No. 10/570,663 to Endo et al., which was filed on Mar. 6, 2006.
U.S. Appl. No. 10/569,942 to Endo et al., which was filed on Feb. 28, 2006.
U.S. Appl. No. 10/570,668 to Endo et al., which was filed on Mar. 6, 2006.

* cited by examiner

METHOD FOR PRODUCING SOI WAFER

FIELD OF THE INVENTION

The present invention relates to a method for producing an SOI wafer, and more particularly to a method for producing an SOI wafer allowing for a surface of the SOI wafer to be planarized.

DESCRIPTION OF THE PRIOR ART

An SOI wafer has been used in an LSI of high-speed low-power consumption, as it is considered superior to a conventional silicon wafer in some properties, including separation between devices, reduced parasitic capacitance between a device and a substrate and a three-dimensional structure to be feasible.

One of methods for producing the SOI wafer in the prior art includes the smart cut method in which hydrogen ion is implanted into a silicon wafer from a surface thereof and then the silicon wafer is bonded to another wafer, and subsequently thus obtained bonded wafer is subjected to a heat treatment for cleavage so as for a part of the silicon wafer to be cleaved and separated away at the site of ion-implanted layer serving as an interface layer. However, according to this method, problematically a resultant surface of the SOI wafer after the cleavage process (i.e., a cleaved surface) typically appears rough. To address this problem, for example, a method for producing an SOI wafer disclosed in the Patent Document 1 has suggested a technique for planarizing the wafer surface in which, after the cleavage process, the wafer is subjected to an oxidation process, which is followed by a heat treatment in a reducing atmosphere containing hydrogen, so as to planarize the surface of the wafer.

Patent Document 1: Japanese Patent Laid-open Publication No. 2000-124092

SUMMERY OF THE INVENTION

Problem to be Solved by the Invention

However, in the method for producing an SOI wafer as disclosed in the above-cited Patent Document 1, the planarization, if performed by taking advantage of etching effect from the hydrogen gas, tends to make the etched surface uneven. In addition, this uneven etch leads to non-uniform film thickness of the SOI layer (active layer). Further, this method requires a step of removing of an oxide film from the wafer surface prior to the treatment using the hydrogen gas, leading to a more complicated process. Additionally a safety procedure is further required under the use of hydrogen gas, and the facility for that is expensive, that is another problem from the viewpoint of cost arises.

The wafer prepared for the active layer used in the SOI wafer may include ones possibly containing crystal defects. If the active layer wafer containing the crystal defects is used, an electric property thereof could be deteriorated, including a lowered withstand voltage of the oxide film of the SOI wafer, for example. Accordingly, the active layer wafer has to employ such a type of wafer as a hydrogen annealed wafer, an epitaxial wafer or a nitrogen doped wafer, all of which are expensive.

An object of the present invention is to provide a method for producing an SOI wafer using the smart cut method, which allows for planarization of a cleaved surface defined as after the wafer having been cleaved and separated.

Another object of the present invention is to provide a method for producing an SOI wafer, which allows for a uniform film thickness of an SOI layer, thereby achieving a reduced film thickness of an SOI layer.

Yet another object of the present invention is to provide a method for producing an SOI wafer, in which even if a silicon wafer containing crystal defects dispersed therein is used as a material, an SOI wafer with a reduced quantity of crystal defect in an SOI layer can be produced successfully.

Means to Solve the Problem

A first invention provides a method for producing an SOI wafer, comprising the steps of:

ion-implanting of hydrogen gas or noble gas element to a wafer for active layer via an insulating film to form an ion-implanted layer in the active layer wafer;

subsequently bonding the active layer wafer with a supporting wafer via the insulating film disposed therebetween to form a bonded wafer; and then heat treating the bonded wafer so as to cleave and separate a part of the active layer wafer at the site of ion-implanted layer as an interface, thereby producing an SOI wafer, wherein after the bonded wafer has been heat treated and the cleavage has been induced at the site of ion-implanted layer as the interface, the SOI wafer is heat treated in an inactive gas atmosphere.

The heat treatment of the SOI wafer in accordance with the smart cut method includes a heat treatment for cleavage directed to provide the cleavage at the site of ion-implanted layer as the interface and another heat treatment for bonding strength enhancement directed to enhance the bonding strength between the active layer wafer and the supporting wafer after the cleavage process. The SOI wafer, as it is after the heat treatment for cleavage, has been damaged by the cleavage and has its surface roughened. To address this, subsequent to the cleavage process, the SOI wafer is held at the predetermined temperature in the inactive gas atmosphere to apply the planarization heat treatment to the wafer.

In the method for producing the SOI wafer according to the first invention, the ion-implanted layer is formed in the active layer wafer in the method for producing the SOI wafer in accordance with the smart cut method. Then, the active layer wafer is bonded with the supporting wafer via the insulating film disposed therebetween. Consequently, this produces the bonded wafer comprising two pieces of wafers that have been bonded together via the insulating film disposed therebetween. After this process, the bonded wafer is subjected to the heat treatment for cleavage so that the bonded wafer is cleaved and separated into two wafers at the site of ion-implanted layer as the interface. This results in the production of the SOI wafer. Subsequently, thus produced SOI wafer is subjected to the heat treatment for planarization in which the SOI wafer is held at the temperature in a range of 1100° C. to 1350° C. in the inactive gas atmosphere consisting of argon gas, for example, for the predetermined time. This induces recrystallization (migration) in the surface (cleaved surface) of the SOI wafer to provide a regular arrangement of crystal lattice of silicon. Thus, it allows the surface (the cleaved surface) of the SOI wafer to be planarized.

A second invention provides a method for producing an SOI wafer as defined in the first invention, in which the heat treatment in the inactive gas atmosphere is performed by holding the SOI wafer at a temperature in a range of 1100° C. to 1350° C. in an argon gas atmosphere for about two hours or longer.

If the argon gas atmosphere is employed as the atmosphere in the heat treatment, less etching effect to the surface of the SOI wafer may be expected as compared to that in the hydrogen gas atmosphere, but it facilitates the planarization of the roughened surface of the SOI wafer after the cleavage process, through the recrystallization (migration) thereof.

It is also to be reminded that the temperature of heat treatment is in a range of 1100° C. to 1350° C. The temperature lower than 1100° C. would fail to induce the recrystallization in the surface of the SOI wafer. If the temperature to be set is higher than 1350° C., it would take a longer time to reach such high temperature, leading to an insufficient throughput in the heat treatment. Disadvantageously, it also tends to cause slipping and/or dislocation defect to appear.

In the method for producing the SOI wafer according to the second invention, the temperature used for the heat treatment of the SOI wafer is held in a range of 1100° C. to 1350° C. This enables the recrystallization (migration) to take effect in the surface of the SOI wafer, so that the surface can be planarized. If the temperature used for the heat treatment for planarization is in a range of 1100° C. to 1350° C., the satisfactory recrystallization takes effect in the surface of the SOI wafer.

It is to be noted that the heat treatment for planarization can be also expected to serve as the heat treatment for bonding strength enhancement.

Further, if the ion implanted layer has been completely cleaved as the interface in the heat treatment for cleavage, this heat treatment for planarization may be applied to both of the SOI wafer and another half or the remaining portion of the cleaved and separated silicon wafer in the same furnace sequentially after the heat treatment for cleavage. This allows the surface (cleaved surface) of the remaining silicon wafer to be planarized, so that the remaining silicon wafer can be reused as the active layer wafer or the supporting wafer.

A third invention provides a method for producing an SOI wafer, comprising the steps of:

ion-implanting of hydrogen gas or noble gas element to a wafer for active layer via an insulating film to form an ion-implanted layer in the active layer wafer;

subsequently bonding the active layer wafer with a supporting wafer via an insulating film disposed therebetween to form a bonded wafer; and then heat treating the bonded wafer so as to cleave and separate a part of the active layer wafer at the site of ion-implanted layer as an interface, thereby producing an SOI wafer, wherein after the bonded wafer has been heat treated and the cleavage has been induced at the site of ion-implanted layer as the interface, the SOI wafer is heat treated in an inactive gas atmosphere and subsequently oxidized to form an oxide film on top of the active layer and the oxide film is then removed.

In the method for producing the SOI wafer according to the third invention, the ion-implanted layer is formed in the active layer wafer in the method for producing the SOI wafer in accordance with the smart cut method. Then, the active layer wafer is bonded with the supporting wafer via the insulating film disposed therebetween. Consequently, this produces the bonded wafer comprising two pieces of wafers that have been bonded together via the insulating film disposed therebetween. After this process, the bonded wafer is subjected to the heat treatment for cleavage so that a part of the active layer wafer is cleaved and separated away at the site of ion-implanted layer as the interface. This results in the production of the SOI wafer. Subsequently, thus produced SOI wafer is subjected to the heat treatment for planarization in which the SOI wafer is held at the temperature in a range of 1100° C. to 1350° C. in the inactive gas atmosphere consisting of argon gas, for example, for the predetermined time. This induces recrystallization (migration) in the surface (cleaved surface) of the SOI wafer and thus allows the surface to be planarized.

Subsequent to this process, the SOI wafer is further oxidized in an oxidizing atmosphere, for example, so as to form the oxide film on top of the SOI layer to a predetermined thickness. The oxide film is then removed by the HF etching, for example. This produces the SOI layer of uniform as well as reduced thickness.

It is further noticed that if any crystal defects (as-grown defect) exist within the silicon wafer prepared to be the active layer, those steps of process can make the crystal defect vanished within the SOI layer. Specifically, if the heat treatment at the temperature in a range of 1100° C. to 1350° C. is carried out in the argon gas atmosphere, an inner wall oxide film of the crystal defect (COP) existing in the SOI layer can be removed, and the additional oxidation process applied after this heat treatment allows for the implantation of interstitial silicon into the SOI layer, which eliminates the crystal defect. Accordingly, this allows the silicon wafer containing the crystal defects therein to be still employed as the active layer wafer.

A fourth invention provides a method for producing an SOI wafer as defined in the third invention, in which the heat treatment in the inactive gas atmosphere is performed by holding the SOI wafer at a temperature in a range of 1100° C. to 1350° C. in an argon gas atmosphere for about two hours or longer.

A fifth invention provides a method for producing an SOI wafer as defined in the third invention, in which after the oxide film on top of the active layer having been removed, the SOI wafer is again oxidized to form an oxide film on top of the active layer and then the oxide film is removed.

In the method for producing the SOI wafer according to the fifth invention, after having been subjected to said heat treatment for planarization, the SOI wafer is subjected to the oxidation process in the oxidizing atmosphere, and then the oxide film formed in this oxidation process on the surface of the SOI wafer (SOI layer) is removed. Further following this process, the SOI wafer having its oxide film removed is again subjected to the oxidation process in the oxidizing atmosphere. Then, thus formed oxide film is removed to thereby provide the SOI layer with much reduced thickness. That is, the oxide film formation and oxide film removal that are carried out two times, respectively, can achieve the further reduced thickness of the SOI layer.

A sixth invention provides a method for producing an SOI wafer as defined in the third or the fifth invention, in which the step of first oxidation process and the step of second oxidation process are performed at a temperature in a range of 600° C. to 1000° C.

In the method for producing the SOI wafer in accordance with the smart cut method, after a part of the active layer wafer having been removed at the site of ion-implanted layer as the interface, the SOI wafer is subjected to the heat treatment at the temperature in a range of 1100° C. to 1350° C. in the argon gas atmosphere (the heat treatment for planarization). Following this process, the SOI wafer is subjected to the oxidation process in the oxidizing atmosphere. The temperature used in the oxidation process is set in a range of 600° C. to 1000° C. The duration of this oxidation process is not limited.

In the method for producing the SOI wafer according to the sixth invention, the temperature used in the above oxidation process is set to be in a range of 600° C. to 1000° C., preferably in a range of 600° C. to 800° C. The temperature lower than 600° C. makes it difficult to form the oxide film having a sufficient thickness on top of the SOI layer. In contrast, the temperature higher than 1000° C. makes it hard to preserve the preferred roughness in the surface of the SOI wafer but may deteriorate the uniformity in thickness of the SOI layer.

Effect Of The Invention

According to the present invention, provided is a method for producing an SOI wafer in accordance with the smart cut method, in which the SOI wafer is heat treated for planarization at a temperature in a range of 1100° C. to 1350° C. in an inactive atmosphere of the argon gas. This facilitates recrystallization (migration) in the surface (cleaved surface) of the SOI wafer and thus the planarization of the surface.

Further, if the SOI wafer is oxidized in an oxidizing atmosphere after the above process, an oxide film having a predetermined thickness is formed on top of the SOI layer. Further following this process, thus formed oxide film is removed by using the HF etching. This provides a uniform thickness as well as a reduced thickness of the SOI layer.

Further, the method of the present invention allows both of the heat treatment for planarization and the oxidation process to be carried out sequentially yet advantageously in the same furnace, so that if the SOI wafer has been completely cleaved and separated in the heat treatment for cleavage, the heat treatment for cleavage or the heat treatment for bonding strength enhancement can be carried out sequentially in the same furnace.

Yet further, even if any crystal defect exists within a silicon wafer prepared to be an active layer, the heat treatment, if applied in an inactive gas atmosphere, can make the crystal defect vanished.

DESCRIPTION OF REFERENCE NUMERALS

10 Active layer wafer
11 SOI wafer
12a Silicon oxide film
12b Buried silicon oxide film (insulating film)
13 SOI layer (active layer)
14 Ion-implanted layer
20 Supporting layer
30 Bonded wafer

DESCRIPTION OF THE PREFERRED EMBODIMENTS

Preferred embodiments of the present invention will now be described with reference to the attached drawings.

First Embodiment

One embodiment of the present invention will now be described with reference to FIG. 1. The description is herein directed to a method for producing an SOI wafer 11 for forming an SOI layer 13 by employing the smart cut method.

Figure 1:
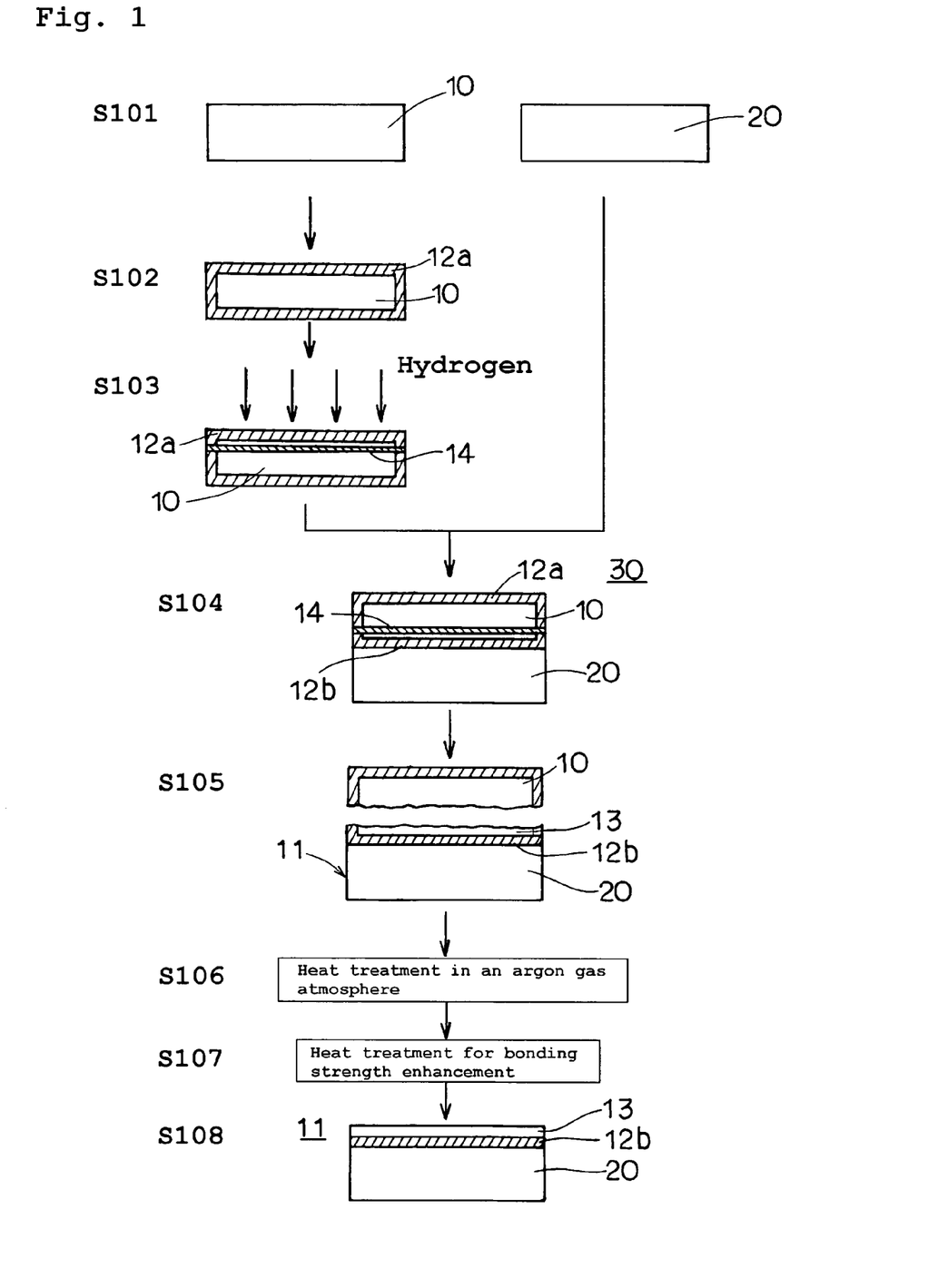
FIG. 1 is a process chart showing a production method of an SOI wafer according to a first embodiment of the present invention.

The production of the SOI wafer 11 in the smart cut method according to the illustrated embodiment may be carried out in a process comprising the steps shown in FIG. 1.

Firstly, two pieces of silicon wafer (one-side mirror polished wafer) are prepared, which have been made by slicing an ingot of monocrystal silicon grown in the CZ method and doped with boron, as shown in step S101 of FIG. 1. One of those prepared silicon wafers serves as an active layer wafer 10 and the other of those silicon wafers serves as a supporting wafer 20. A silicon oxide film ($SiO_2$) 12a is then formed on top of the silicon wafer prepared as the active layer wafer 10, as shown in step S102 of FIG. 1. The formation of the silicon oxide film 12a is achieved by introducing the silicon water into an oxidizing furnace and heating the silicon wafer at a predetermined temperature for a predetermined time. The silicon oxide film 12a to be formed in this process may have a thickness of 150 nm.

Secondly, the active layer wafer 10 with the silicon oxide film 12a formed thereon is set in a vacuum chamber of an ion-implanting device. Then, a predetermined dose of hydrogen ion is implanted into the active layer wafer 10 from its surface side (i.e., the mirror polished side thereof) through the silicon oxide film 12a, as shown in step S103 of FIG. 1. The hydrogen ion is implanted to a predetermined depth measured from the surface of the active layer wafer 10, and consequently an ion-implanted layer 14 is formed in the active layer wafer 10 at the predetermined depth (extending across a predetermined range of depth within the silicon substrate).

Subsequently, the active layer wafer 10 with the hydrogen ion implanted therein is bonded with the supporting wafer 20 at the side of ion-implanted surface (i.e., silicon oxide film 12a surface) used as the bonding surface for the active layer wafer 10, as shown in step S104 of FIG. 1. This bonding process may be carried out by a known technology for laminating the mirror polished surfaces to each other at a room temperature. Resultantly, a bonded wafer 30 including an insulating film (i.e., the silicon oxide film 12a) intervening in the bonding interface is formed. In this process, the silicon oxide film 12a disposed in the abutting region between the active layer wafer 10 and the supporting wafer 20 turns to be a buried silicon oxide film (i.e., insulating film) 12b.

Then, thus bonded wafer 30 undergoes a heat treatment approximately at 500° C. in a nitrogen atmosphere, as shown in step S105 of FIG. 1. This is referred to as a heat treatment for cleavage. As it is, bubbles of noble gas (hydrogen gas) are formed in the ion-implanted layer 14 of the bonded wafer 30, and a part of the active layer wafer 10 (i.e., a part of the bonded wafer 30) is cleaved and separated from the remaining part thereof at the region containing bubbles in the ion-implanted layer 14 as the interface. Specifically, the bonded wafer 30 is cleaved and separated to be an SOI wafer 11 comprising an SOI layer 13 (a part of the active layer wafer 10) laminated over the supporting wafer 20 via the silicon oxide film interposed therebetween and the remaining portion of the active layer wafer 10.

Those steps to be taken up to this stage of processing are analogous to the steps employed in a method for producing the SOI wafer 11 in a typical smart cut method.

Subsequently, another heat treatment for planarization is applied to the SOI wafer after its having been subjected to the heat treatment for cleavage, as shown in step S106 of FIG. 1.

This heat treatment for planarization is performed by holding the SOI wafer 11 in the argon gas atmosphere at the temperature in a range of 1100° C. to 1350° C. for about two hours. It is to be noted that this heat treatment for planarization can be carried out sequentially following the heat treatment for cleavage by using the same furnace, if the heat treatment for cleavage has achieved the complete cleavage in the bonded wafer 30 at the site of ion-implanted layer 14 as the interface.

At this stage of processing, to confirm that the cleaved surface of the SOI wafer 11 has been planarized, the surface of the SOI wafer 11 is examined by using an atomic force microscope (AFM). A value of RMS (root-mean-square roughness) of the cleaved surface of the bonded wafer 30 before the heat treatment for planarization read approximately 8 nm (2×2 µm). Specifically, it was observed in the surface of the SOI layer after the cleavage that the silicon crystal lattice that has been disordered by the implantation of the hydrogen ion is exposed on top of the layer.

The RMS value is measured again by using the AFM in the surface (cleaved and separated surface) of the SOI wafer 11 after the about two-hour heat treatment for planarization. The RMP value measured after the heat treatment for planarization has been improved to be 0.1 nm or lower. This is because the heat treatment for planarization induces recrystallization (migration) in the cleaved surface of the SOI layer to form a regular arrangement of silicon crystal lattice. As a result, the SOI layer surface (cleaved surface) of the SOI wafer 11 is successfully planarized. Although the state of crystal in the wafer surface before the cleavage is defined by the monocrystal structure, the state of crystal in the wafer surface after the cleavage includes the arrangement of crystal lattice that has been disordered due to the damage given to the wafer surface from the cleavage.

The remaining silicon wafer (the remaining portion of the active layer wafer) that has been cleaved and separated at the ion-implanted layer 14 as the interface can also undergo the heat treatment at the same time under the same condition as this SOI wafer 11. This can also planarize the surface (cleaved surface) of said remaining silicon wafer, and thus treated silicon wafer can be reused as the active layer wafer 10 or the supporting wafer 20.

After this step, the SOI wafer 11 is subjected to a thermal treatment for bonding strength enhancement so that the active layer wafer 10 and the supporting wafer 20 may be firmly bonded together, as shown in step S107 of FIG. 1. The condition for the heat treatment may be defined such that the treatment would be carried out in an oxidizing gas atmosphere at the temperature of 1100° C. or higher for about two hours. The above-described heat treatment for planarization may be carried out sequentially before or after this heat treatment for bonding strength enhancement.

Finally, a process for reducing the film thickness of SOI layer 13 is carried out to complete the production of the SOI wafer 11. For example, the surface of the SOI layer 13 is ground and thus ground surface is further polished to make it a mirror surface.

A result from an experiment of the heat treatment for planarization executed under different process conditions will now be reported.

The SOI wafer 11 produced via the above designated steps, or S101 of FIG. 1 to S105 of FIG. 1, was subjected to the heat treatment (i.e., the heat treatment for planarization) shown in step S106 of FIG. 1 in the argon gas atmosphere for about two hours under the different conditions of temperature at 1000° C., 1100° C., 1200° C. and 1300° C. After each heat treatment, the RMS value of the surface of the SOI layer 13 of the SOI wafer 11 was measured by using the AFM. An evaluation of the bonding strength enhancement and slip (for reference only) of the SOI wafer 11 was also made. The result is presented in the table below.

It is to be noted that the term "good" in the planarization in Table 1 indicates that the RMS value of the surface of the bonded wafer 30 before the heat treatment for planarization had been improved to approximately 0.1 nm (2×2 µm) after the treatment. On the other hand, the term "insufficient" in the table indicates that the RMS value had not yet been improved to approximately 0.1 nm (2×2 µm). The term "good" in the bonding strength enhancement in Table 1 indicates that the bonding between the active layer wafer 10 and the supporting wafer 20 after the bonding process was not broken by any known procedures, while the term "insufficient" indicates inverse condition thereof.

TABLE 1

| Temperature | 1000° C. | 1100° C. | 1200° C. | 1300° C. |
|---|---|---|---|---|
| Planarization | Insufficient | Good | Good | Good |
| Bonding strength enhancement | Insufficient | Good | Good | Good |
| Slip | Not observed | Not observed | Not observed | Observed |

It has been also made apparent from the experiment result as indicated above that if the cleaved and separated SOI wafer 11 undergoes the heat treatment for planarization as it is held at the temperature in a range of 1100° C. to 1350° C. in the argon gas atmosphere, the surface of the SOI wafer 11 is recrystallized and thus planarized.

Second Embodiment

Figure 2:
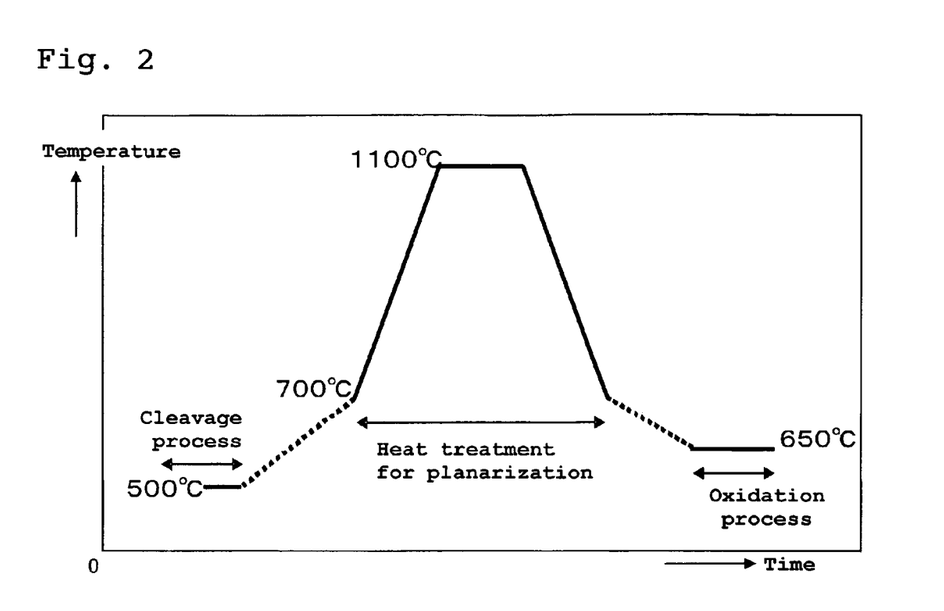
FIG. 2 is a graphical representation showing a relationship between a heat treatment temperature and a process time effective from a heat treatment for cleavage to an oxidation process in a production method of an SOI wafer according to a second embodiment of the present invention.

A second embodiment of the present invention will now be described with reference to FIGS. 2 and 3.

A method for producing an SOI wafer 11 according to this embodiment is defined by the method for producing an SOI wafer 11 according to the above-discussed first embodiment which has been modified as described below. Specifically, after the heat treatment for cleavage having been applied to the bonded wafer, the process for planarization and further the oxidation process are also applied to the SOI wafer to form the oxide film 40 having a predetermined thickness on top of the SOI layer 13, and after that, thus formed oxide film 40 is removed by using, for example, the etching with the HF solution.

Figure 3:
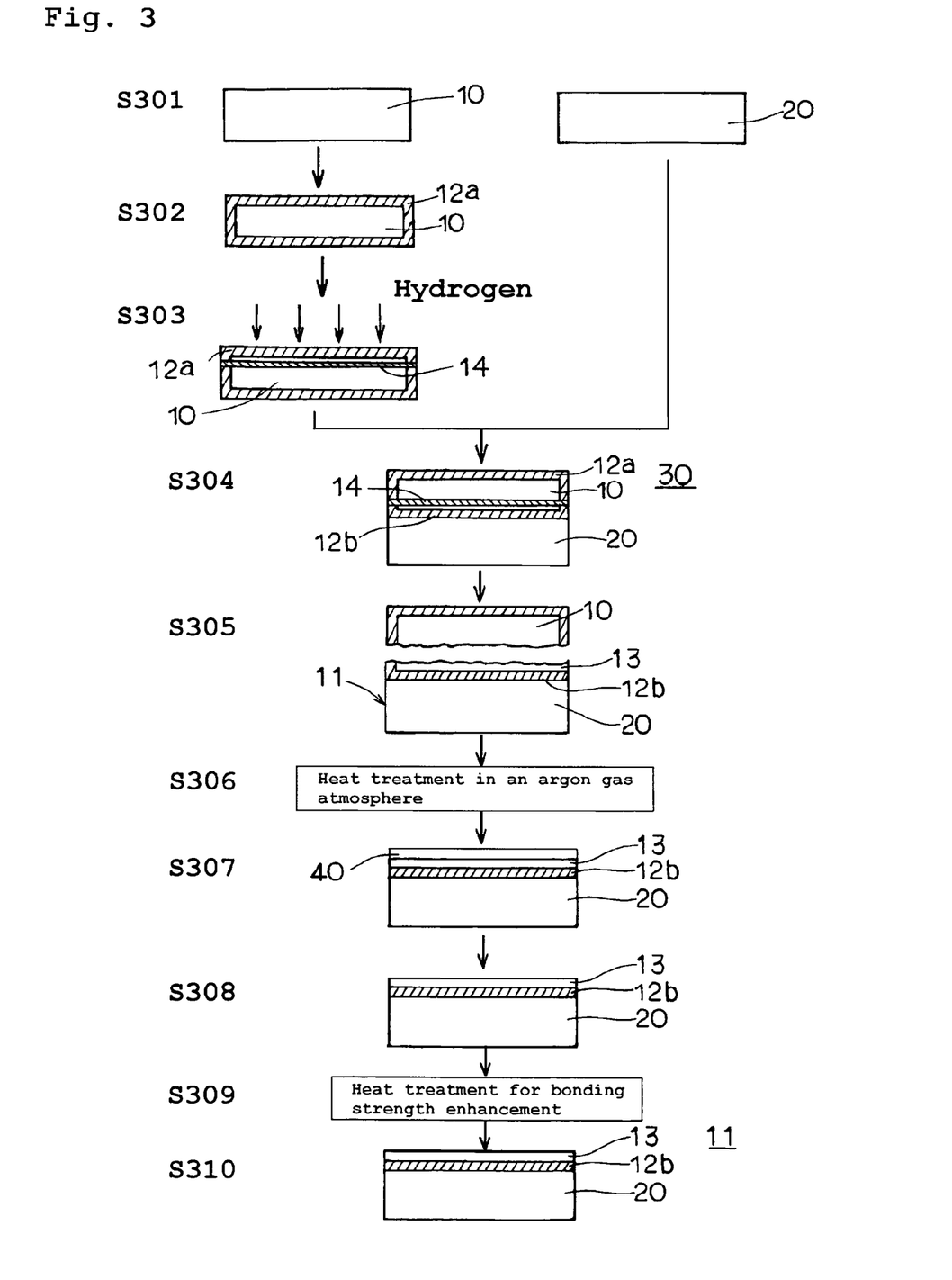
FIG. 3 is a process chart showing a production method of an SOI wafer according to the second embodiment of the present invention.

That is, the steps of process as designated by S301 to S306 of FIG. 3 are analogous to the steps of process as designated by S101 to S106 of FIG. 1. Following to those steps, a wet oxidation process is applied to the SOI wafer 11 in an oxidizing atmosphere at a temperature of 650° C. for one hour, as shown in step S307 of FIG. 3. As a result, the oxide film 40 having a predetermined thickness is formed on top of the SOI layer 13. This oxidation process may be carried out sequentially after said heat treatment for planarization as shown in FIG. 2 (step S306 of FIG. 3). FIG. 2 shows that the heat treatment for cleavage at 500° C., the heat treatment for planarization at 1100° C. and the oxidation process at 650° C. are performed sequentially in the same furnace.

Then, thus formed oxide film 40 is removed by using, for example, the HF etching, as shown in step S308 of FIG. 3. This provides the uniform and reduced thickness of the SOI layer 13.

The wet oxidation process is advantageous in that it can achieve a higher oxidation rate of silicon as well as a shorter heat treatment time than the oxidation process performed in a dry oxidizing atmosphere. It is also effective to add the hydrogen gas and/or use such a gaseous form as HCl oxidation having a higher oxidation rate.

Further, it may be made possible to reduce the thickness of the SOI layer 13 by carrying out the oxidation process in a lower temperature range allowing for the formation of anisotropic oxide film 40 while maintaining the surface as planarized by the heat treatment in the argon gas atmosphere. The oxidation temperature at this process is in a range of 600° C. to 1000° C., preferably in a range of 600° C. to 800° C.

After this step, a thermal treatment for bonding strength enhancement is applied to the SOI wafer 11 in order to provide an enhanced bonding between the active layer wafer 10 and the supporting wafer 20, as shown in step S309 of FIG. 3. The condition for the heat treatment is defined such that the treatment is carried out in an oxidizing gas atmosphere at the temperature of 1100° C. or higher for about two hours. The heat treatment for planarization and the oxidation process may be carried out sequentially before or after this heat treatment for bonding strength enhancement.

Finally, a process for reducing the film thickness of SOI layer 13 (for example, final polishing) is carried out to complete the production of the SOI wafer 11.

A result from an experiment of the heat treatment for planarization and the oxidation process as described above, which has been executed under different process conditions respectively, will now be reported.

The SOI wafer produced via the above designated steps, or S301 of FIG. 3 to S306 of FIG. 3, was subjected to the oxidation process (i.e., the step shown in S307 of FIG. 3) for about one hour under the different conditions of temperature at 500° C., 600° C., 700° C., 800° C., 900° C., 1000° C. and 1100° C. so as to form the oxide film 40 having the predetermined thickness on top of the SOI layer 13. After this step, the oxide film 40 was removed by the etching with the HF solution (the step shown in S308 of FIG. 3).

Then, the RMS value in the surface of each of the SOI wafer 11 was measured by using the AFM. Evaluations of the film thickness reduction and the planarization of the SOI layer 13 of the SOI wafer 11 as well as the uniformity of thickness of the SOI layer 13 were also made. The evaluations were made by the known methods, respectively. The result thereof is presented in the table 2 below.

It had been also confirmed that the heat treatment for planarization had successfully annihilated crystal defects (as-grown), if any exist within the silicon wafer used as the active layer, of the SOI wafer 11.

It is to be noted that the term "good" in the result of film thickness reduction in Table 2 indicates that with respect to the SOI layer having the predetermined thickness (500 nm), the film thickness has been reduced to 100 nm as measured after the heat treatment for planarization. The term "insufficient" indicates that the film thickness has not been reduced to 100 nm. The term "good" in the planarization indicates that the RMS value has been improved to approximately 0.1 nm (2×2 μm) or lower. The term "fair" indicates that the RMS value in a part within the wafer surface has been improved to approximately 0.1 nm (2×2 μm) or lower. On the other hand, the term "insufficient" in the table indicates that the RMS value has not yet been improved to approximately 0.1 nm (2×2 μm). Respective terms used in the uniformity of thickness of the SOI layer 13 can be read similarly.

TABLE 2

| Temperature | 500° C. | 600° C. | 700° C. | 800° C. | 900° C. | 1000° C. | 1100° C. |
|---|---|---|---|---|---|---|---|
| Film thickness reduction | Insufficient | Good | Good | Good | Good | Good | Good |
| Planarization | Good | Good | Good | Good | Fair | Fair | Insufficient |
| Uniformity of SOI layer | Preserved | Preserved | Preserved | Preserved | A bit deteriorated | A bit deteriorated | Deteriorated |

Considering the result from the experiment as presented above, the SOI wafer 11 after the cleavage was subjected to the heat treatment for planarization as it was held in the argon gas atmosphere at the temperature in a range of 1100° C. to 1350° C. and then to the oxidation process. After those steps, the oxidation film 40 was removed, and thus the film thickness of the SOI layer 13 was made uniform. More advantageously, it has become apparent that the film thickness reduction of the SOI layer 13 is also made possible. In contrast, if the SOI wafer is oxidized without carrying out the heat treatment for planarization in the inactive gas atmosphere, the film thickness reduction is still possible but a lesser effect of the planarization will be brought about, where the RMS value in the wafer surface >0.1 nm (2×2 μm), inhibiting the surface roughness required for the production of device from being obtained.

Third Embodiment

A third embodiment will now be described with reference to FIGS. 3 and 4.

A method for producing an SOI wafer 11 according to the present embodiment is defined by the method for producing the SOI wafer 11 according to the above-discussed second embodiment which has been modified as described below. Specifically, the oxide film 40 is formed over the SOI wafer after having undergone the heat treatment for planarization (step S406 of FIG. 4), and then after thus formed oxide film having been removed, the SOI wafer 11 is subjected to the oxidation process again so as to form an oxide film 40 having a predetermined thickness on top of the SOI layer 13, which oxide film 40 is removed later. This means that the oxidation process and the removal process of the oxide film 40 are performed twice, respectively.

Figure 4:
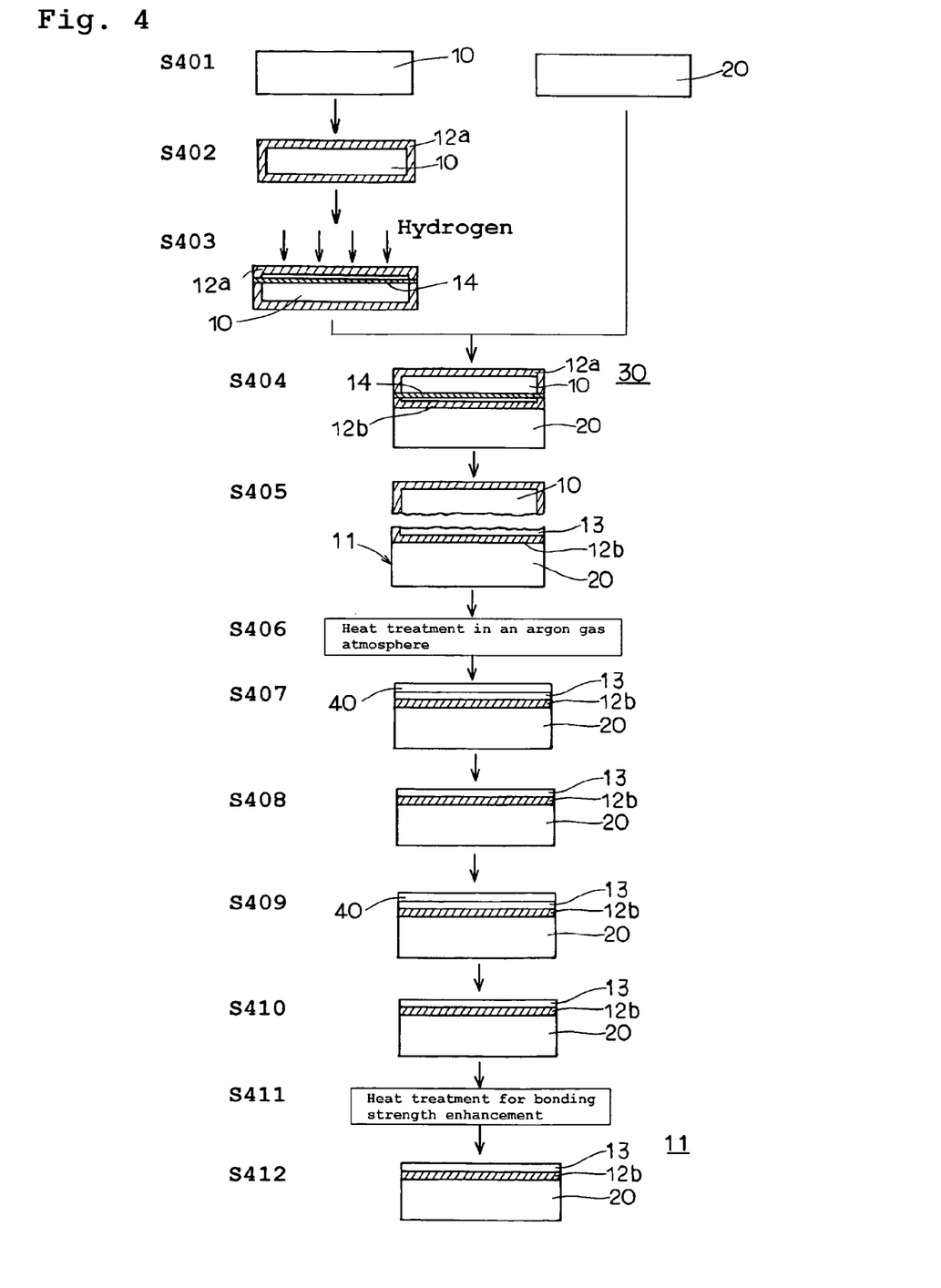
FIG. 4 is a process chart showing a production method of an SOI wafer according to a third embodiment of the present invention.

Specifically, the steps of process as designated by S401 to S408 of FIG. 4 are analogous to the steps of process as designated by S301 to S308 of FIG. 3. Following to those steps, a wet oxidation process is applied to the SOI wafer 11 in an oxidizing gas atmosphere at 650° C. for one hour, as shown in step S409 of FIG. 4, so that the oxide film 40 having the predetermined thickness is formed on top of the SOI layer 13. Later on, this oxide film 40 is removed by the HF etching, for example, as shown in step S410 of FIG. 4. A series of steps as designated above (i.e., the oxidation process and the HF etching) may be applied not only twice but also three or more times.

This can facilitate more favorable reduction of film thickness of the SOI layer 13, while preserving the roughness thereof as after the planarization. That is, if a machining allowance of the SOI layer 13 is large, then after the oxide film 40 having been formed by oxidizing the SOI wafer, this oxide film 40 may be removed by using, for example, the HF etching, which can be applied repeatedly to thereby reduce the film thickness of the SOI layer 13.

It is to be noted that following the oxidation process (step S409 of FIG. 4) and the etching (step S410 of FIG. 4), a heat treatment for bonding strength enhancement (step S411 of FIG. 4) and a surface finish-polishing (step S412 of FIG. 4) are carried out.

Fourth Embodiment

It is also contemplated in the first embodiment that the process for reducing the film thickness of the SOI layer may be achieved by grinding and mirror polishing applied to the surface of the SOI layer, after the SOI wafer having undergone the heat treatment (i.e., the heat treatment for planarization) and the heat treatment for bonding strength enhancement in the argon gas atmosphere as described above. Result from this indicated that the thickness of the SOI layer 13 was easily reduced to 100 nm or thinner and also the roughness of the surface was improved to be 0.1 nm or lower. The other steps of the process are analogous to those in the first embodiment.

What is claimed is:

1. A method for producing an SOI wafer comprising
ion-implanting of hydrogen gas or noble gas element to a wafer for active layer via an insulating film to form an ion-implanted layer in said active layer wafer;
subsequently bonding said active layer wafer with a supporting wafer via an insulating film disposed therebetween to form a bonded wafer; and then
heat treating said bonded wafer so as to cleave and separate a part of said active layer wafer at the site of ion-implanted layer as an interface, thereby producing an SOI wafer, wherein
after the cleavage bas been induced, said SOI wafer at a temperature in a range of 1100° C. to 1350° C. in an argon gas atmosphere for about two hours or longer.

2. A method for producing an SOI wafer comprising
ion-implanting of hydrogen gas or noble gas element to a wafer for active layer via an insulating film to form an ion-implanted layer in said active layer wafer;
subsequently bonding said active layer wafer with a supporting wafer via an insulating film disposed therebetween to form a bonded wafer; and then
heat treatment of said bonded wafer so as to cleave and separate a part of said active layer wafer at the site of ion-implanted layer as an interface, thereby producing an SOI wafer, wherein
after the cleavage has been induced the heat treatment in said inactive gas atmosphere is performed by holding said SOI wafer at a temperature in a range of 1100° C. to 1350° C. in an argon gas atmosphere for about two hours or longer and subsequently oxidized to form an oxide film on top of said active layer and said oxide film is then removed.

3. A method for producing an SOI wafer in accordance with claim 2, in which after said oxide film on top of said active layer having been removed, said SOI wafer is again oxidized to form an oxide film on top of said active layer and then said oxide film is removed.

4. A method for producing an SOI wafer in accordance with claim 2, in which the oxidation process is performed at a temperature in a range of 600° C. to 1000° C.

5. A method for producing an SOI wafer in accordance with claim 3, in which the oxidation process is performed at a temperature in a range of 600° C. to 1000° C.

* * * * *